(12) United States Patent
Kuiri

(10) Patent No.: US 7,778,620 B2
(45) Date of Patent: *Aug. 17, 2010

(54) CONTROLLING PHASE LOCKED LOOP IN A MOBILE STATION

(75) Inventor: Tapio Kuiri, Oulu (FI)

(73) Assignee: Nokia Corporation, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/655,543

(22) Filed: Jan. 19, 2007

(65) Prior Publication Data

US 2007/0117521 A1 May 24, 2007

Related U.S. Application Data

(63) Continuation of application No. 10/668,776, filed on Sep. 23, 2003, now Pat. No. 7,324,795.

(51) Int. Cl.
*H04B 1/40* (2006.01)

(52) U.S. Cl. ............... 455/260; 455/183.1; 455/258

(58) Field of Classification Search ............... 455/260, 455/76, 113, 180.3, 75, 77, 118, 120, 150.1, 455/179.1, 180.1, 180.4, 183.1, 183.2, 188.1, 455/255, 256, 257, 258; 331/16
See application file for complete search history.

(56) References Cited

U.S. PATENT DOCUMENTS

| 5,495,206 | A | 2/1996 | Hietala |
| 5,731,741 | A | 3/1998 | Yamamoto et al. |
| 5,999,793 | A | 12/1999 | Ben-Efraim et al. |
| 6,157,821 | A | 12/2000 | Boesch et al. |
| 6,308,055 | B1 * | 10/2001 | Welland et al. ............. 455/260 |
| 6,317,006 | B1 * | 11/2001 | Welland et al. ............... 331/25 |
| 6,624,705 | B1 * | 9/2003 | Huard et al. .................. 331/16 |
| 6,636,727 | B2 | 10/2003 | Muschallik et al. |
| 6,680,653 | B2 | 1/2004 | Griffith et al. |
| 6,708,044 | B1 * | 3/2004 | Puknat et al. ............ 455/552.1 |
| 6,724,265 | B2 | 4/2004 | Humphreys |
| 6,885,873 | B2 | 4/2005 | Ravi et al. |
| 6,977,537 | B2 | 12/2005 | Chaudhuri et al. |

* cited by examiner

*Primary Examiner*—Blane J Jackson
(74) *Attorney, Agent, or Firm*—Hollingsworth & Funk, LLC

(57) ABSTRACT

A method of controlling a phase locked loop in a mobile station and a mobile station of a cellular telecommunications system are provided. The mobile station comprises an integrated phase locked loop for generating output frequencies; a frequency control unit for providing a frequency control word for the phase locked loop, according to which frequency control word an output frequency is generated; and a tuning unit for providing a synchronized tuning word for the phase locked loop, the tuning unit being configured to output the synchronized tuning word to the phase locked loop in synchronization with the output of the frequency control word. The invention reduces the settling time of a mobile station when an operating frequency is changed from one to another.

14 Claims, 2 Drawing Sheets

CONTROLLING PHASE LOCKED LOOP IN A MOBILE STATION

RELATED APPLICATIONS

Figure 1:
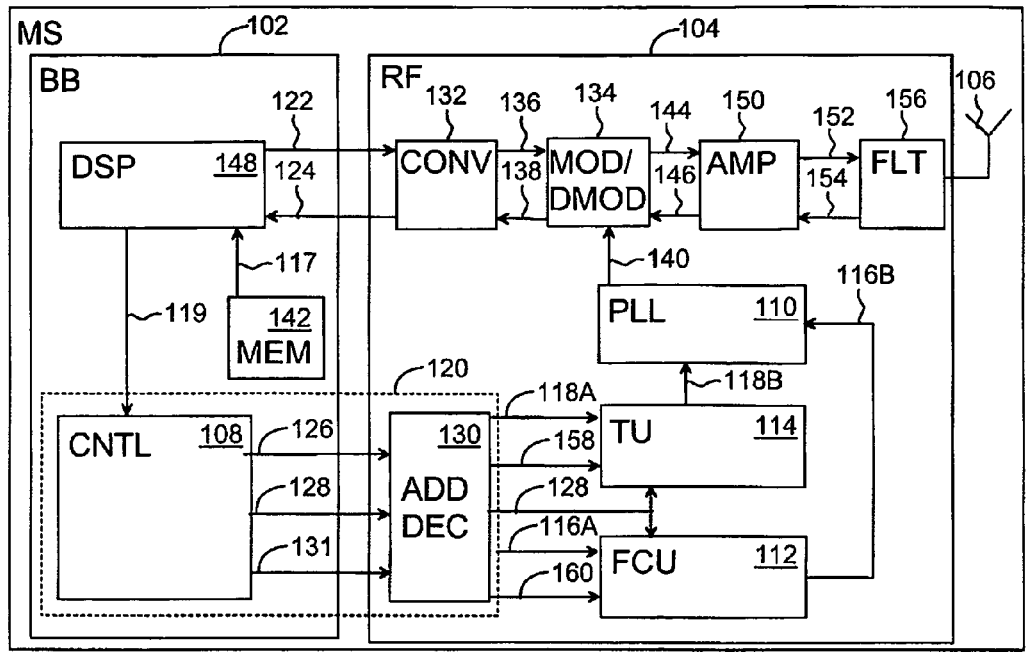

This application is a continuation of prior application Ser. No. 10/668,776, filed Sep. 23, 2003 and issued as U.S. Pat. No. 7,324,795, the content of which is incorporated herein by reference in its entirety.

FIELD

The invention relates to a method of controlling a phase locked loop in a mobile station, and a mobile station. Especially, the invention relates to an integrated phase locked loop.

BACKGROUND

A phase locked loop (PLL) implemented with an integrated circuit (IC) provides an efficient technique for synthesizing radio frequencies in mobile stations in telecommunications systems. A phase locked loop is known as a feedback system for providing signals with accurate and stable signal characteristics, such as frequency and phase. In telecommunications systems utilizing a plurality of carrier frequencies, a phase locked loop is required to be capable of generating several radio frequencies with desired accuracy.

However, deficiencies in the operation of an integrated phase locked loop may occur due to variations in the operating temperature and operating frequency, thus degrading signal characteristics of the phase locked loop. The degraded signal characteristics may lead to inaccuracy in the carrier frequencies, thus reducing the quality of the radio connection between a mobile station and the radio network, or in a worse scenario, even preventing the connection.

BRIEF DESCRIPTION OF THE INVENTION

An object of the invention is to provide an improved method for controlling a phase locked loop and an improved mobile station.

According to a first aspect of the invention, there is provided a mobile station of a cellular telecommunications system, the mobile station comprising: an integrated phase locked loop for generating output frequencies; a frequency control unit for providing a frequency control word for the phase locked loop, according to which frequency control word an output frequency is generated; and a tuning unit for providing a synchronized tuning word for the phase locked loop, the tuning unit being configured to output the synchronized tuning word into the phase locked loop in synchronization with the output of the frequency control word.

According to a second aspect of the invention, there is provided a method of controlling a phase locked loop of a mobile station of a cellular telecommunications system, the method including: outputting a frequency control word into the phase locked loop, according to which frequency control word an output frequency is generated; and outputting a synchronized tuning word into the phase locked loop in synchronization with the output of the frequency control word.

Preferred embodiments of the invention are described in the dependent claims.

The method and mobile station of the invention provide several advantages. The synchronization of the output of the synchronized tuning word with the output of the frequency control word results in reduction in the settling time when a frequency generated by the phase locked loop is changed from one to another. The reduced settling time increases the time efficiency of the telecommunications system.

LIST OF DRAWINGS

Figure 3:
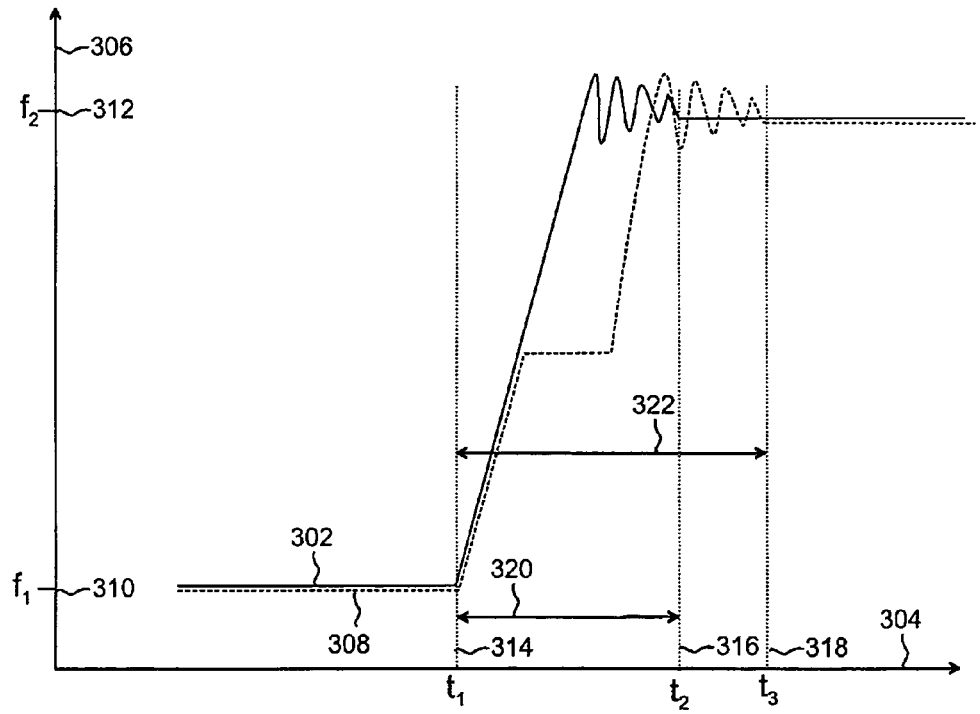
Figure 2:
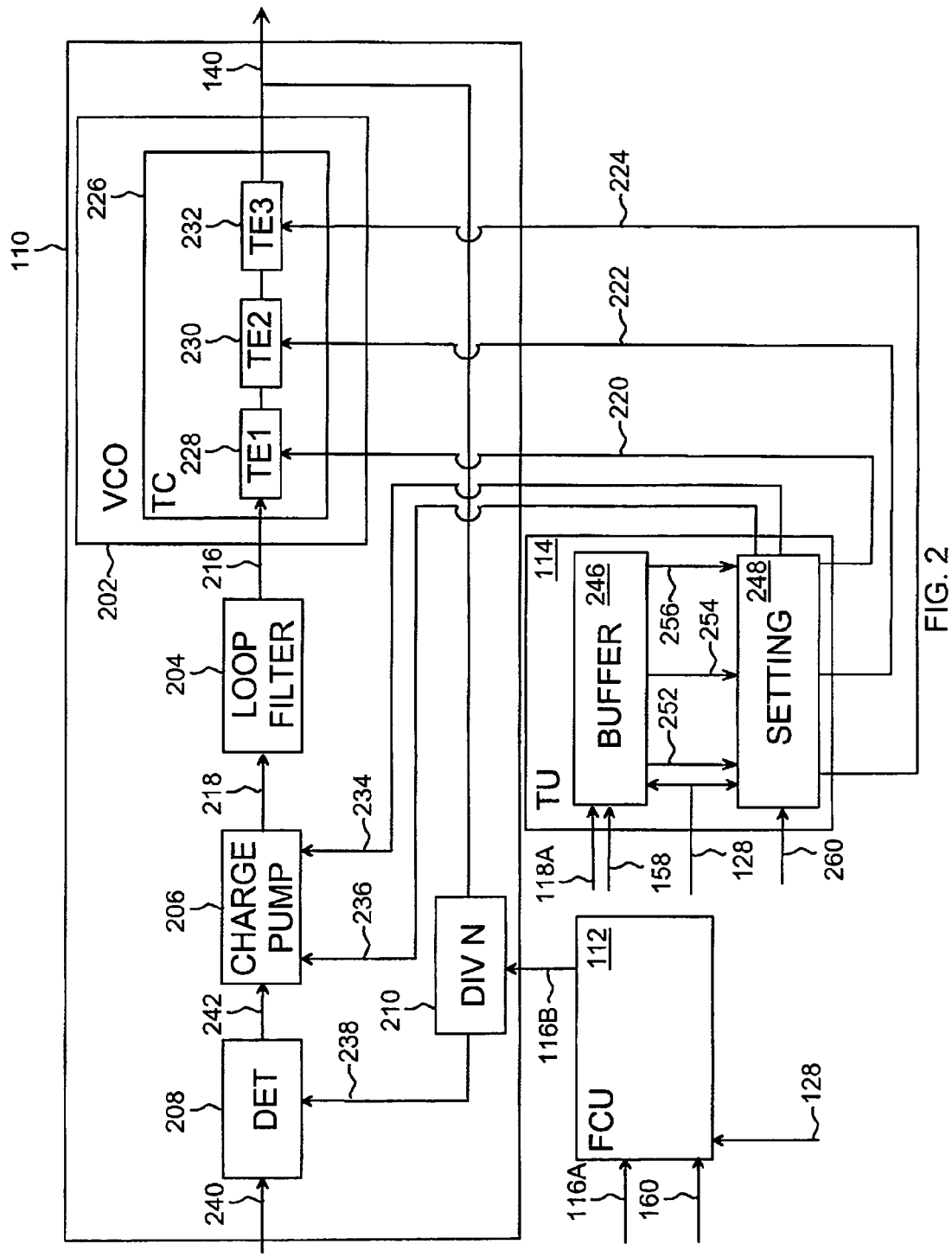

In the following, the invention will be described in greater detail with reference to the preferred embodiments and the accompanying drawings, in which FIG. 1 shows a first example of a mobile station according to embodiments of the invention;

FIG. 2 shows a second example of a mobile station according to embodiments of the invention; and FIG. 3 illustrates output frequency curves of a phase locked loop in a frequency transition state.

DESCRIPTION OF EMBODIMENTS

FIG. 1 shows an exemplary mobile station to which the invention may be applied. The mobile station includes a base band part 102 (BB), a radio frequency part 104 (RF) connected to the base band part 102, and an antenna 106 connected to the radio frequency part 104. The exemplified radio frequency part 104 includes a phase locked loop 110.

The base band part 102 includes a digital signal processor 148, a control unit 108, and memory means 142. A portion of the base band part 102 may be implemented with an application specific integrated circuit (ASIC). The control unit 108 may be implemented with a computer and software.

In transmission, a converter unit 132 receives a transmit base band digital signal 122 from the base band part 102 and converts the transmit base band digital signal 122 into a transmit base band analog signal 136. The transmit base band analog signal 136 is inputted into a modulator-demodulator unit 134, which up-converts the transmit base band analog signal 136 into a radio frequency, thus providing a transmit radio frequency signal 144. The I and Q components of the transmit base band analog signal 136 are up-converted separately if an IQ-modulator is used.

The output frequency 140 of the phase locked loop 110 is inputted into the modulator-demodulator unit 134. The modulator-demodulator unit 134 may include a mixer for mixing the transmit base band analog signal 136 and the output frequency 140. The mixer generates the transmit radio frequency signal 144, whose frequency is generally an algebraic sum of the output frequency 140 and the frequency of the transmit base band analog signal 136.

The I and Q components of the transmit base band analog signal 136 are up-converted in separate mixers, which are provided with separate output frequencies 140 with $\pi/2$ phase difference. After mixing, the I and Q components of the transmit radio frequency signal 144 are summed in a summer.

The transmit radio frequency signal 144 is inputted into an amplifier unit 150, which amplifies the transmit radio frequency signal 144, thus providing an amplified transmit antenna signal 152. The amplification may be implemented by using a linear amplifier, for example.

The amplified transmit signal 152 is fed into the filter unit 156, which attenuates undesired signal components from the amplified transmit signal 152, thus providing a desired transmit antenna signal for the antenna 106.

In reception, the antenna 106 converts the electromagnetic field providing the air interface into a receive antenna signal. The receive antenna signal is inputted into the filter unit 156, which attenuates undesired signal components of the receive antenna signal, thus producing a receive radio frequency signal 154. The filter unit 156 may be a duplex filter for separating the transmit antenna signal from the receive antenna signal.

The receive radio frequency signal 154 is inputted into the amplifier unit 150, which amplifies the receive radio frequency signal 154 by means of a low noise amplifier, for example. As a result of amplification an amplified receive signal 146 is obtained.

The amplified receive signal 146 is inputted into the modulator-demodulator unit 134, which down-converts the amplified receive signal 146 into the base band frequency, thus providing a receive base band analog signal 138. The down-conversion may be based on mixing the amplified receive signal 146 with the output frequency 140 of the phase locked loop 110. The modulator-demodulator unit 134 may include separate mixers for down-converting I and Q components of the amplified receive signal 146.

The receive base band analog signal 138 is inputted into the converter unit 132, whose analog-to-digital converter samples the receive base band analog signal 138 and produces a receive base band digital signal 124. The receive base band digital signal 124 is inputted into the base band parts 102. The converted unit 132 may include separate analog-to-digital converters for converting the I and Q components of the receive base band analog signal 138.

A mobile station may include a plurality of phase locked loops 110 with associated frequency control units 112 and tuning units 114. Different phase locked loops 110 may be utilized for producing different frequencies for down-conversion and up-conversion. Furthermore, a phase locked loop may be used for providing intermediate frequencies. It is clear to a person skilled in the art to implement an arrangement including a plurality of phase locked loops.

It is common that a mobile station is capable of receiving/transmitting at a plurality of radio frequency bands defined by the specification of the telecommunications system. For example, in the GSM system (Global System for Mobile Communications), the frequency separation of adjacent carriers is 200 kHz. The operation frequency of the mobile station is changed from one to another, for example, due to a channel change command from the network, or a predetermined frequency hopping pattern.

The operating frequency of the mobile station may be controlled by feeding an appropriate output frequency 140 into the modulator-demodulator unit 134. The operating frequency of the mobile station is proportional to the output frequency 140 of the phase locked loop 110, and thus the signal characteristics, such as phase and frequency, of the output frequency 140 of the phase locked loop 110 have a substantial impact on the quality of the reception and transmission characteristics of the mobile station.

The mobile station includes a frequency control unit 112 (FCU) for providing a frequency control word 116B for the phase locked loop 110, according to which frequency control word 116B the output frequency 140 is generated in the phase locked loop 110.

FIG. 1 further shows an exemplary control arrangement 120 including a control unit 108 and an address decoder 130 connected to the control unit 108. The control arrangement 120 is connected to the tuning unit (TU) 114 and the frequency control unit 112. The control arrangement 120 may further be connected to the digital signal processor 148.

The frequency control unit 112 may comprise a register, such as a shift register, for receiving and/or buffering the frequency control word 116A from the control arrangement 120. The frequency control unit 112 feeds the frequency control word 116B into the phase locked loop at a predefined time instant and in a predefined format. The phase locked loop 110 generates the output frequency 140 according to the value of the frequency control word 116B. In an embodiment, the frequency control word 116B is fed in parallel format into the phase locked loop 110. The frequency control word 116A includes the information on the value of the frequency control word 116B. However, the format between the two may be different.

The frequency control word 116A, 116B typically defines large-scale frequency characteristics, such as the carrier frequency generated in the modulator-demodulator unit 134. The frequency control word 116B may be a binary number proportional to the output frequency 140.

The tuning unit is provided with a tuning word 118A by the control arrangement 120. The tuning unit 114 may receive and/or buffer the tuning word 118A and provide a synchronized tuning word 118B for the phase locked loop 110. The tuning word 118A includes the information on the value of the synchronized tuning word 118B. However, the format between the tuning word 118A and the synchronized tuning word 118B may be different. A synchronized tuning word 118B may be a binary number, which includes bits which control tuning of the phase locked loop 110. The synchronized tuning word 118B may affect the signal characteristics, such as frequency shift and phase noise, of a signal produced by the phase locked loop 110.

The synchronized tuning word 118B is outputted from the tuning unit 114 into the phase locked loop 110 in synchronization with the output of the frequency control word 116B. When synchronized, the timing of the output of the synchronized tuning word 118B depends on the timing of the output of the frequency control word 116B in a predefined manner. For example, there may be a predefined time gap between the output of the frequency control word 116B and the output of the synchronized tuning word 118B. The time gap is typically a multiple of the clock cycle provided by a clock signal 128 fed into the frequency control unit 112 and the tuning unit. In an embodiment, the frequency control word 116B is outputted prior to the synchronized tuning word 118B. In another embodiment, the synchronized tuning word 118B is outputted prior to the frequency control word 116B.

In an embodiment, the synchronized tuning word 118B and the frequency control word 116B are outputted simultaneously from the tuning unit 114 and the frequency control unit 112, respectively, into the phase locked loop 110. In such a case, the simultaneous timing may be based on a shared enabling signal, which validates simultaneously both the output of the frequency control word 116B and the synchronized tuning word 118B.

The values of the frequency control word 116B and/or the tuning word may 118B be defined in various components of the mobile station depending on the embodiment.

In an embodiment, the frequency control word 116A is generated in the control unit 108 of the control arrangement 120 according to, for example, a control signal 119 provided by the digital signal processor 148. The control signal 119 may include, for example, a channel number of the radio channel to be applied in the transmission. The control unit 108 may calculate the value for the frequency tuning word 116A based on the channel number. Furthermore, the control unit 108 may calculate the value for the tuning word 118A based on the channel number. The calculation of the tuning word 118A may be based on the output frequency 140 to be produced, the prevailing temperature of the phase locked loop 110, or an other predictable factor affecting on the output frequency 140.

It is also possible that the digital signal processor 148 retrieves the channel number using signal 117 from the memory means 142, which may be implemented with a ROM (Read Only Memory), for example.

The exemplified control arrangement 120 may provide a first timing signal 160 for the frequency control unit 112, the first timing signal 160 timing the output of the frequency control word 116B from the frequency control unit to the phase locked loop 110. The control unit 108 may further provide a second timing signal 158 for the tuning unit 114, the second timing signal 158 timing a synchronous output of the synchronized tuning word 118B from the tuning unit 114 to the phase locked loop 110. The input of the first timing signal 160 and the second timing signal 158 may trigger the output of the frequency control word 116B and the synchronized tuning word 118B, respectively.

It is also possible that the first timing signal 160 and the second timing signal 158 include information on the timing, which information is realized in the frequency control unit 112 and the tuning unit 114, respectively. In such a case, the frequency control unit 112 and the tuning unit 114 preferably include unit-specific or shared timing logic circuits capable of validating the output of the frequency control word 116B and the synchronized tuning word 118B based on the first timing signal 160 and the second timing signal 158, respectively.

The control unit 108 may feed a bit stream 126 including a data portion and an address portion into the address decoder 130, which routes the data portion of the bit stream 126 to a desired destination. The data portion of the bit stream 126 may be outputted either into the tuning unit 114 or the frequency control unit 112 indicated by the address portion. If the address portion indicates the tuning unit 114, the data portion includes the tuning word 118A, and the address decoder 130 outputs the tuning word 118A into the tuning unit 114. If the address portion indicates the frequency control unit 112, the data portion includes the frequency control word 116A, and the address decoder 130 outputs the frequency control word 116A into the frequency control unit 112.

The control unit 108 may further feed a clock signal 128 into the address decoder 130. The clock signal 128 may be utilized for synchronizing the data transfer between the control unit 108 and the address decoder 130. Furthermore, the clock signal 128 may be fed into the tuning unit 114 and the frequency control unit 112 and utilized for synchronizing data transfer between the address decoder 130 and the tuning unit 114, and the frequency control unit 112. The clock signal may be fed into the tuning unit 114 and the frequency control unit 112 directly from the control unit 108 or via the address decoder 130.

The control arrangement 120 may further feed a timing signal 131, also called a latch, into the address decoder 130. The timing signal 131 may be converted to a first timing signal 160 inputted into the frequency control unit 112 or to a second timing signal 158 inputted into the tuning unit 114 based on the address portion of the bit stream 126. In the simultaneous output of the synchronized tuning word 118B and the frequency control word 116B, the timing signal 131 is preferably converted both into the first timing signal 160 and the second timing signal 158 simultaneously.

Some units, such as the converter unit 132, the modulator-demodulator unit 134, the frequency control unit 112, the tuning unit 114, and the address decoder 130 may be implemented on a radio frequency ASIC, for example. The control unit 108 may be implemented using a digital computer in the base band part 102. The control unit 108 may also be implemented with a software application in the digital signal processor 148.

FIG. 2 shows the phase locked loop 110, the frequency control unit 112, and the tuning unit 114.

The exemplified phase locked loop 110 includes an integrated voltage controlled oscillator 202, a loop filter 204, an integrated charge pump 206, a detector unit 208, and a feedback divider 210.

The output frequency 140 outputted by the phase locked loop 110 may be generated by the voltage controlled oscillator 202. It is also possible that the voltage controlled oscillator 202 precedes a post-divider not shown, which divides the frequency produced by the voltage controlled oscillator 202. In such a case the output frequency 140 represents the divided frequency. The output frequency 140 is still proportional to the voltage level 216 provided by the loop filter 204 connected to the voltage controlled oscillator 202. The voltage level 216 provided by the loop filter 204 is controlled with current 218 generated by the charge pump 206 connected to the loop filter 204.

In an embodiment of the invention, the tuning unit 114 outputs the synchronized tuning word 118B in parallel format to the phase locked loop 110. The parallel format enables a simultaneous realization of the bits of the synchronized tuning word 118B in the phase locked loop 110, thus speeding up the tuning process.

In an embodiment of the invention, the tuning unit 114 outputs the synchronized tuning word 118B into the voltage controlled oscillator 202. FIG. 2 shows parallel bits 220, 222, 224 of the synchronized tuning word 118B delivered parallel to the voltage controlled oscillator 202. The bits 220, 222, 224 are delivered to tuning elements 228, 230, 232 of a tuning circuit 226. A tuning element 228, 230, 232 may be a resonator including resistors, capacitors, coils, diodes and transistors, thus affecting signal characteristics of the voltage controlled oscillator 202 and enabling frequency tuning of the output frequency 140. A bit 220, 222, 224 of the synchronized tuning word 118B may determine the state of a switch of a tuning element 228, 230, 232.

The switch states of the tuning elements 228, 230, 232 provide a plurality of frequency tuning configurations, each frequency tuning configuration contributing to characteristics of the voltage controlled oscillator 202. For example, an 8 bit tuning word is typically capable of controlling 256 tuning configurations.

The synchronized tuning word 118B may further control a bias current of the voltage controlled oscillator 202. In an embodiment, the synchronized tuning word 118B controls an amplifier buffer located between the voltage controlled oscillator 202 and the modulator-demodulator unit 134.

In an embodiment of the invention, the tuning unit 114 provides a synchronized tuning word 118B for the charge pump 206 in order to tune the gain of the charge pump 206. The bits 234, 236 of the synchronized tuning word 118B may control switches in the charge pump 206, which switches alter the electric properties, such as output current, of the charge pump 206, and thus the gain of the charge pump 206.

The feedback divider 210 uses the output frequency 140 as input and generates a feedback signal 238 with frequency proportional to the output frequency 140. The frequency of the feedback signal 238 is also proportional to a ratio factor N. The frequency $f_{FB}$ of the feedback signal may be expressed as a function of the ratio factor N and the output frequency 140 $f_{OUT}$ as follows $$f_{FB} = f_{OUT}/N \quad (1)$$

The detector unit 208 may use a reference signal 240 and the feedback signal 238 as input, detect a frequency and/or phase difference between the feedback signal 238 and the reference signal 240, and apply a control signal 242 to the charge pump 206 according to the detected difference. The reference signal 240 originates, for example, from a crystal oscillator.

In an embodiment of the invention, the frequency control unit 112 outputs a frequency control word 116B into the feedback divider 210. The value of the frequency control word 116B may be, for example, the value of the ratio factor N. When the frequency control word 116B is outputted from the frequency control unit 112 into the feedback divider 210, the frequency of the feedback signal 238 is changed, and the detector unit 208 adjusts the control signal 242 accordingly. As a result, the phase locked loop 202 searches for an output frequency 140 multiple of N of the frequency of the reference signal 240. When synchronizing the output of the synchronized tuning word 118B with the output of the frequency control word 116B, the settling time of the phase locked loop 110 may be reduced.

It is clear to a person skilled in the art that the value and the structure of the synchronized tuning word 118B depends on the target, such as the voltage controlled oscillator 202, charge pump 206, and feedback divider 210, of the synchronized tuning word 118B. Separate tuning units 114 may be used to control the above targets.

With reference to FIG. 3, an output frequency curve 302 of a phase locked loop 110 is shown. The x-axis 304 and y-axis 306 show time and frequency, respectively, on an arbitrary scale.

FIG. 3 illustrates a situation where the output frequency 140 of the phase locked loop 110 is changed from a first output frequency 310 ($f_1$) to a second output frequency 312 ($f_2$) due to a channel change command or frequency hopping operation, for example. Before time instant 314 ($t_1$), the phase locked loop 110 generates a first output frequency $f_1$ according to a first tuning word and a first frequency control word.

At time instant $t_1$, the first frequency control word is replaced by a second frequency control word in the phase locked loop 110, and the phase locked loop 110 searches for the second output frequency 312 corresponding to the second frequency control word.

During a transition state, i.e. a time interval when the phase locked 110 loop searches for the desired second output frequency 312, a second tuning word is outputted from the tuning unit 114 into the phase locked loop 110. As a result, the second output frequency 312 is obtained at time instant 316 ($t_2$), thus resulting in settling time 320 between the time instants 314 and 316.

With further reference to FIG. 2, consider an embodiment of the invention wherein the tuning unit 114 includes a buffer register 246, such as a shift register, for receiving a tuning word 118A in a serial format. The buffer register 246 converts the serial format of the tuning word 118A into a parallel format, thus outputting the bits 252, 254, 256 of the parallel-format tuning word 118A into the setting register 248 connected to the buffer register 246 and the phase locked loop 110. The setting register 248 may output bits 220, 222, 224 of the synchronized tuning word 118B in parallel format to the phase locked loop 110 after receiving an enabling command 260. The setting register 248 may be implemented with D-flip flops, for example.

The buffer register 246 may receive the tuning word 118A while the phase locked loop 110 is still generating the first output frequency 310, and the setting register 248 is still validated with the first tuning word.

At time instant 314, the enabling command 260 is inputted into the setting register 248, which enabling command 260 enables the output of the second tuning word into the phase locked loop 110. In an embodiment, the enabling command 260 is the same as the enabling command enabling the output of the frequency control word 116B. The tuning circuit 226 receives the second tuning word and sets the switches of the tuning elements 228, 230, 232 according to the bits 220, 222, 224 of the second tuning word. As a result, the second output frequency 312 is tuned, and the phase locked loop 110 generates a tuned output frequency 312.

In an embodiment of the invention, the frequency control unit 112 and the tuning unit 114 provide a shared control register for the frequency control word 116B and the synchronized tuning word 118B, and the shared control register is configured to output the frequency control word 116B and the synchronized tuning word 118B simultaneously. The shared control register may be implemented by using a register structure similar to the one applied in the tuning unit 114. The buffer register 246 may receive the frequency control word 116A and the tuning word 118A in serial format, and outputs the combined control word into the setting register 248. The combined control word, which includes both the frequency control word 116B and the synchronized tuning word 118B, may be enabled by using a shared enabling command 260.

In an embodiment, the control unit 108 switches off the synchronous output of the synchronized tuning word 118B. In such a case, the phase locked loop 110 is capable of operating according to the invention, but may be switched to operate in a manner according to the prior art.

FIG. 3 further shows a frequency curve 308 indicated with a dashed line, which would be obtained if the tuning control word 118B were changed non-synchronously with the output of the frequency control word 116B. A stabilized second output frequency 312 would be obtained at time instant 318 ($t_3$), thus resulting in a longer settling time 322 than what would be obtained by using the synchronous output of the synchronized tuning word 118B.

Even though the invention is described above with reference to an example according to the accompanying drawings, it is clear that the invention is not restricted thereto but it can be modified in several ways within the scope of the appended claims.

What is claimed is:

1. A mobile station circuit comprising:
    an integrated phase locked loop for generating output frequencies;
    a frequency control unit for providing a frequency control word for the phase locked loop, according to which frequency control word an output frequency is generated;
    a tuning unit for providing a synchronized tuning word for the phase locked loop, the tuning unit being configured to output multiple parallel bits of the synchronized tuning word into respective multiple tuning elements of the phase locked loop in synchronization with the output of the frequency control word; and
    an integrated voltage controlled oscillator for generating the output frequency proportional to a voltage level inputted into the voltage controlled oscillator, wherein the tuning unit is configured to output the synchronized tuning word into the voltage controlled oscillator.

2. The mobile station circuit of claim 1, wherein the voltage controlled oscillator includes a tuning circuit for providing a plurality of frequency tuning configurations, a frequency tuning configuration contributing to frequency characteristics of the voltage controlled oscillator; and the tuning unit is configured to output the synchronized tuning word for the tuning circuit in order to set a frequency tuning configuration.

3. The mobile station circuit of claim 1, wherein the phase locked loop includes a feedback divider connected to the frequency control unit, the feedback divider being configured to generate a feedback signal with frequency proportional to a frequency control word; and the frequency control unit is configured to output a frequency control word into the feedback divider.

4. The mobile station circuit of claim 1, wherein the multiple tuning elements of the phase locked loop comprise resonators.

5. The mobile station circuit of claim 1, wherein the multiple parallel bits of the synchronized tuning word control switch states of the respective multiple tuning elements to provide a plurality of frequency tuning configurations, each frequency tuning configuration contributing to characteristics of the phase locked loop.

6. The mobile station circuit of claim 1, wherein the frequency control word causes a change in the output frequency generated by the phase locked loop, and wherein outputting the multiple parallel bits of the synchronized tuning word into the respective multiple tuning elements of the phase locked loop substantially simultaneously with the output of the frequency control word reduces a settling time of the phase locked loop.

7. A method comprising:

outputting a frequency control word into a phase locked loop of a mobile station of a cellular telecommunications system, according to which frequency control word an output frequency is generated;

outputting multiple parallel bits of a synchronized tuning word into respective multiple tuning elements of the phase locked loop in synchronization with the output of the frequency control word; and outputting the synchronized tuning word from the tuning unit into an integrated voltage controlled oscillator to generate the output frequency proportional to a voltage level inputted into the voltage controlled oscillator.

8. A method according to claim 7, further including outputting the synchronized tuning word simultaneously with the frequency control word.

9. The method of claim 7, wherein the multiple tuning elements of the phase locked loop comprise resonators.

10. The method of claim 7, wherein the multiple parallel bits of the synchronized tuning word control switch states of the respective multiple tuning elements to provide a plurality of frequency tuning configurations, each frequency tuning configuration contributing to characteristics of the phase locked loop.

11. The method of claim 7, wherein the frequency control word causes a change in the output frequency generated by the phase locked loop, and wherein outputting the multiple parallel bits of the synchronized tuning word into the respective multiple tuning elements of the phase locked loop substantially simultaneously with the output of the frequency control word reduces a settling time of the phase locked loop.

12. A mobile station circuit comprising:

an integrated phase locked loop for generating output frequencies;

a frequency control unit receiving a frequency control word in a first format, converting the frequency control word into a second format, and providing the frequency control word of the second format to the phase locked loop to identify an output frequency to be generated by the phase locked loop; and a tuning unit for providing a synchronized tuning word for the phase locked loop, the tuning unit being configured to output multiple parallel bits of the synchronized tuning word into respective multiple tuning elements of the phase locked loop substantially simultaneously with the output of the frequency control word, wherein the multiple tuning elements of the phase locked loop comprise resonators.

13. The mobile station circuit of claim 12, wherein the multiple parallel bits of the synchronized tuning word control switch states of the respective multiple tuning elements to provide a plurality of frequency tuning configurations, each frequency tuning configuration contributing to characteristics of the phase locked loop.

14. The mobile station circuit of claim 12, wherein the frequency control word causes a change in the output frequency generated by the phase locked loop, and wherein outputting the multiple parallel bits of the synchronized tuning word into the respective multiple tuning elements of the phase locked loop substantially simultaneously with the output of the frequency control word reduces a settling time of the phase locked loop.

* * * * *

UNITED STATES PATENT AND TRADEMARK OFFICE
CERTIFICATE OF CORRECTION

PATENT NO. : 7,778,620 B2  
APPLICATION NO. : 11/655543  
DATED : August 17, 2010  
INVENTOR(S) : Tapio Kuiri Page 1 of 1

It is certified that error appears in the above-identified patent and that said Letters Patent is hereby corrected as shown below:

On the Front Page:

Col. 1, Assignee: "Nokia Corporation, St. Paul, MN (US)" should read --Nokia Corporation, Espoo (FI)--.

Signed and Sealed this

Fourteenth Day of December, 2010

David J. Kappos  
*Director of the United States Patent and Trademark Office*